United States Patent [19]
Doty

[11] Patent Number: 6,087,832
[45] Date of Patent: Jul. 11, 2000

[54] EDGE-WOUND SOLENOIDS AND STRONGLY COUPLED RING RESONATORS FOR NMR AND MRI

[75] Inventor: F. David Doty, Columbia, S.C.

[73] Assignee: Doty Scientific, Inc., Columbia, S.C.

[21] Appl. No.: 09/074,451

[22] Filed: May 6, 1998

Related U.S. Application Data

[60] Provisional application No. 60/045,683, May 6, 1997.

[51] Int. Cl.⁷ ........................................................ G01V 3/00
[52] U.S. Cl. ............................................................. 324/318
[58] Field of Search ............................. 324/318, 320–322

[56] References Cited

U.S. PATENT DOCUMENTS

| | | | |
|---|---|---|---|
| 4,549,136 | 10/1985 | Zens | 324/308 |
| 4,878,022 | 10/1989 | Carlson | 324/318 |
| 4,920,318 | 4/1990 | Misic | 324/318 |
| 5,132,278 | 7/1992 | Stevens et al. | 505/231 |
| 5,226,947 | 7/1993 | Jablonski et al. | 75/245 |
| 5,363,845 | 11/1994 | Chowdhury | 128/653.5 |
| 5,424,645 | 6/1995 | Doty | 324/318 |
| 5,539,315 | 7/1996 | Cory | 324/318 |

FOREIGN PATENT DOCUMENTS 404129111  4/1992  Japan .

OTHER PUBLICATIONS

M. L. Banson, G. P. Cofer, R. Black, and G. A. Johnson, "A Probe for Specimen Magnetic Resonance Microscopy," *Invest. Radiology*, 27, 2, 157–164, 1992.

F.D. Doty, "Probe Design & Construction," *Encyclopedia of NMR*, vol. 6, Wiley Press, 1996.
F.D. Doty, "Solid State NMR Probe Design," *Encyclopedia of NMR*, vol. 7, Wiley Press, 1996.
J. Hyde, "Surface & Other Local Coils for In Vivo Studies," *Encylcopedia of NMR*, vol. 7, Wiley Press, 1996.
Hoult, D.I., "The NMR Receiver: A Description and Analysis of Design," Progress in NMR Spectroscopy., vol. 12, pp. 41–77, (relevant pp. 61–63) 1978.

*Primary Examiner*—Christine K. Oda
*Assistant Examiner*—Tiffany A. Fetzner
*Attorney, Agent, or Firm*—Oppedahl & Larson LLP

[57] ABSTRACT

An edge-wound NMR solenoidal sample coil is made by winding at least two turns of flattened wire around a cylindrical coilform such that the major cross-sectional axis of the flat wire is perpendicular to the axis of the solenoid. The space between turns near the center is greater than the space between turns at the ends but less than the major cross-sectional dimension of the flat wire. The flattened wire is magnetically compensated by forming copper tubing around paramagnetic wires. The resulting solenoid has considerably higher $\eta_F Q$ and $B_1$ homogeneity than prior-art solenoids of comparable size and transverse transparency. Similar principles may be used to improve the segmented, transparent, loop-gap resonator for breast and other imaging applications by using segmented planar ring resonators, tightly coupled by means of balanced transmission lines at the magic angle, with outermost conductive surfaces oriented more in the radial than axial direction. Similar principles may also be used to produce an improved, segmented, conical surface coil.

19 Claims, 3 Drawing Sheets

EDGE-WOUND SOLENOIDS AND STRONGLY COUPLED RING RESONATORS FOR NMR AND MRI

RELATED APPLICATIONS

This application claims priority from pending U.S. Provisional Application Ser. No. 60/045,683 filed on May 6, 1997, which is hereby incorporated by reference.

FIELD OF THE INVENTION

The field of this invention is the measurement of nuclear magnetic resonance (NMR) for the purpose of determining molecular, microscopic, or macroscopic structure, and, more particularly, an improved solenoidal rf sample coil.

BACKGROUND OF THE INVENTION

The sample coil has been known to be of critical importance to NMR sensitivity since the initial experiments more than 50 years ago, and solenoids of various designs have been consistently selected for numerous applications because of their advantages in Q and filling factor $\eta_F$. Twenty years ago, David Hoult's classic work showed that in his experiments, best performance ($\eta_F Q$ product) was generally obtained with round wire of diameter such that the space between turns was about half the diameter of the wire. Three years later, I showed that closely spaced flattened wire was preferred because of higher $\eta_F$ and improved $B_1$ and $B_0$ homogeneity (without compensation), although Q may be slightly lower, and this geometry became standard practice for more than a decade (see 'Probe Design and Construction', in *The Encyclopedia of NMR,* Vol. 6, Wiley Press, 1996). Prior-art multi-turn rf sample coils utilizing flattened conductors have utilized pure copper and have always oriented the conductors such that the major cross-section axis is parallel to the coil axis and the minor cross-section axis is perpendicular to the coil axis. This configuration is denoted 'flat-wrapped'.

About four years ago, with the advent of preliminary rf magnetic finite element analysis (M-FEA) software, we discovered that current density over the surface of the wire was more concentrated along the inner edges at the ends of the solenoid than had previously been expected. Hence, we found some improvement in Q from making solenoids from round wire that had been flattened only at the central turns, as noted in a copending application on thermal buffering of transverse resonators and in the above referenced article. However, Hoult's original design is often still regarded as optimum for Q, as evidenced in U.S. Pat. No. 5,539,315, for example.

Other prior art low-inductance NMR solenoids utilized two parallel round wires for similar advantages in $Q_0$ and $B_1$. Numerous electro-mechanical transducers, especially loudspeaker voice-coils and moving-coil motors and generators, have often utilized flattened edge-wound conductors (major cross-section of conductor perpendicular to coil axis) for better impedance match to the desired source and for improved mechanical performance. However, one of the objectives of all such prior edge-wound coils is also to achieve nearly 100% filling of a field gap with copper, so space between turns is the minimum required for electrical insulation and is typically a small fraction of the minimum dimension of the flat wire. Electromagnetic skin depths in prior edge-wound multi-turn transducer coils, at least at the minimum frequency of intended use, are usually very large compared to the major cross-section dimension of the wire.

As disclosed in the referenced copending application, there are numerous NMR applications, particularly in VAS or DAS at high fields (see 'Solid State Probe Design', in *The Encyclopedia of NMR,* Vol. 6, Wiley Press, 1996), where it is advantageous to utilize a transverse coil for $^1H$ decoupling in combination with a solenoid for the low frequencies. When a transverse coil is present (or when transverse access is needed for other reasons), it is necessary to increase the relative space between turns of the solenoid to improve performance of the transverse coil (or for other access). Prior work had shown round wire to be preferred over flat-wrapped wire under these conditions. However, with solenoids of two to six turns, increasing the relative space (either with round or flat-wrapped conductors) between turns causes a sharp drop in $\eta_F$ and Q and degradation in $B_1$ and $B_0$ homogeneity, although the effects become less significant with increasing number of turns. The drop in Q is considerably greater than predicted by available M-FEA software, suggesting that currents are less concentrated at edges than indicated by current software or rf resistivity and skin depth are larger than expected. Hence, the degree of the advantage that is found with edge-wound transparent rf solenoids where skin depths are very small compared to wire dimensions and where wire widths are comparable to turns spacing is quite surprising. $B_0$ inhomogeneity is exacerbated by the edge-wound coil, but the effects may be reduced by careful magnetic compensation. Prior-art compensation methods include electroplating copper over zinc-plated aluminum and co-extruding round copper over round aluminum wire.

The single-turn rf solenoid, normally referred to as a split-ring or loop-gap resonator (see 'Surface and Other Local Coils for In Vivo Studies', by James Hyde, in *The Encyclopedia of NMR,* Vol. 7, Wiley Press, 1996,), has sometimes been configured as an open structure utilizing a number of narrow bands paralleled along the gap where the capacitors are inserted, as by Chowdhury et al in U.S. Pat. No. 5,363,845. This makes it more transparent to transverse gradient or rf fields, as would often be present in MRI, although the design by Chowdhury et al has inadequate transverse transparency for optimum performance under some conditions. The prior-art transparent-loop-gap resonators have used round wire and ribbon, both flat-wrapped and edge-wound, as the edge-wound configuration was found to have lower parasitic capacitance to the sample. Prior-art edge-wound transparent-loop-gap resonators for large samples have had space between bands much greater than five times the major cross-sectional dimension b of the bands, with b less than 5% of the coil inside radius r. The relatively low $\eta_F$ and $Q_0$ of prior-art edge-wound loop-gap coils is sometimes inconsequential in applications where sample losses dominate, although higher $B_1$ homogeneity is usually preferred. Magnetically coupled loops (as disclosed by Banson et al in 'A Probe for Specimen Magnetic Resonance Microscopy', *Invest. Radiology,* 27, 2, 157–164, 1992), consisting of two magnetically coupled, planar, loop-gap resonators etched on dielectric substrates with b comparable to or even larger than r, have also been used for MR microscopy. However, their distributed capacitors negate the primary objective of segmentation—i.e., reduction of electric fields in the sample. Multi-turn planar foil spirals have also been used as surface coils.

SUMMARY OF THE INVENTION

An edge-wound NMR solenoidal sample coil is made by winding at least two turns of flattened wire around a cylindrical coilform such that the major cross-sectional axis of the flat wire is perpendicular to the axis of the solenoid. The space between turns near the center is greater than the space between turns at the ends but less than the major cross-sectional dimension of the flat wire. The flattened wire is magnetically compensated by forming copper tubing around paramagnetic wires. The resulting solenoid has considerably higher $\eta_F Q$ and $B_1$ homogeneity than prior-art solenoids of comparable size and transverse transparency. Similar principles may be used to improve the segmented, transparent, loop-gap resonator for microscopy, breast, and other imaging applications by using segmented ring resonators, tightly coupled by means of balanced transmission lines at the magic angle, with outermost conductive surfaces oriented more in the radial than axial direction. Similar principles may also be used to produce an improved, segmented, conical surface coil.

DETAILED DESCRIPTION OF THE PREFERRED EMBODIMENT

Figure 1:
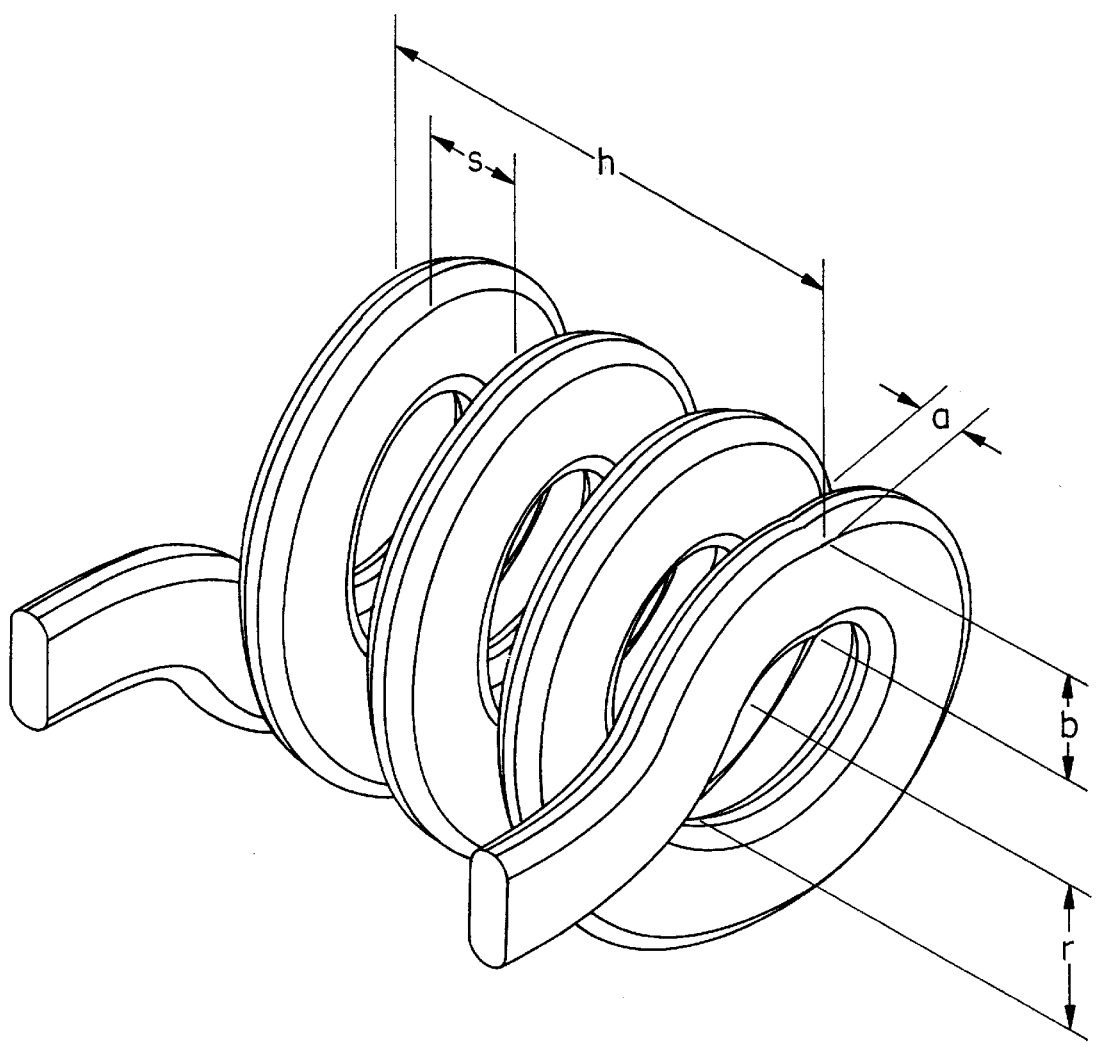
FIG. 1 illustrates the edge-wound rf solenoid.

Edge-wound solenoids. The edge-wound solenoidal rf coil with transverse transparency is illustrated in FIG. 1. The solenoid has n turns, where n is an integer greater than 1, inside radius r, and overall length h. The wire has minor cross-sectional thickness a and major cross-sectional width b. Typically, $(n+1)b > 0.8h$, $b > 1.2a$, and $h >> 3r$. Space s (gap) between turns near the center is greater than $0.8a$ but less than $4b$ (usually less than b for small coils) and space between turns near the ends is less than a. Hence, the pitch, $a+s$, is usually variable, but generally symmetric with respect to the center. The pitch near the center may preferably be greater than $1.8a$ but less than $4b+a$. The unloaded $Q_0$ for small 4-turn coils (7 mm inner diameter by 10 mm length) at 100 MHz is increased by up to a factor of two compared to similar transparent solenoids using round wire of diameter a, even when the classical rf skin depth is less than one tenth of a, and $\eta_F$ is increased by up to 40%. The coil may have fewer than 9 turns and may be tuned to a frequency at which the classical skin depth in the conductor is less than $a/4$. It is likely that only a minor fraction of the improvement comes from reduced lead losses, and that a substantial portion of the improvement comes from the reduced current concentrations on the flattened ends of the solenoid and from the increased conductor surface area where the pitch is increased near the center. When a is much less than b, some additional improvement in Q is possible by inclining the major axis of the outermost turns outward up to 40° or greater than 0 such that the axial space between turns is greater at large radii than at small radii—analogous to the inclined coupled ring resonator shown in FIG. 4.

Figure 2:
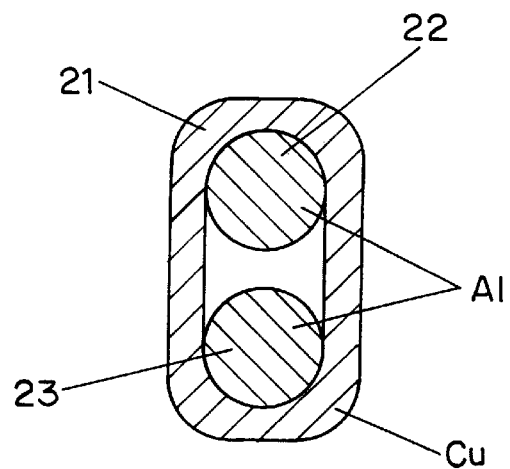
FIG. 2 illustrates a magnetically compensated flattened copper tube.

The preferred conductor for the multi-turn solenoid is magnetically compensated copper. FIG. 2 illustrates one method of producing the compensated conductor using wires of positive magnetic susceptibility, commonly referred to as paramagnetic. A copper tube 21 is partially flattened; two (or more) paramagnetic wires 22, 23 of appropriate magnetization are inserted into the partially flattened tube; and the flattening is then completed to secure the paramagnetic wires inside the copper. Alternatively, a single, paramagnetic strip may be used in place of the paramagnetic wires. In this way the conductor has a magnitude of bulk magnetic susceptibility substantially less than that of pure copper. Often, the paramagnetic material would be aluminum, (denoted by the chemical symbol Al in FIG. 2) but copper-nickel or tungsten-rhenium alloys would be preferred for high-temperature operation. Suitable copper-nickel alloys typically contain 4% to 14% nickel, less than 0.005% and preferably less than 0.01% (Fe+Co+Mn), and a total of at least 0.2% alloying content such as grain stabilizers and hardeners from a subset of the following elements: Al, Cr, Mo, Nb, Re, Ta, Ti, Si, Sn, V, W. Suitable W—Re alloys typically contain 3% to 30% rhenium and less than 0.005% (Co+Fe+Mn+Ni).

Additional steps are required to prevent the flattened tubing from breaking, twisting, buckling, or spreading when being bent edgewise into the desired helix, especially for $b/a > 1.5$. One approach is first to plate the paramagnetic wires with silver, zinc, cadmium, tin, or any braze alloy and then to follow the final flattening with a vacuum anneal at a temperature sufficient to form a metallurgical bond between the paramagnetic wires and the inside of the copper tubing while simultaneously softening the work-hardened copper. In this case, copper-nickel wires are preferred, as they are easily plated and have thermal expansion comparable to that of pure copper. If aluminum compensation wires are used, a better approach may be to coat the wires with epoxy, as aluminum is quite difficult to plate. In any case, the cross-section of the paramagnetic core material is chosen so as to negate the diamagnetism of the copper and bonding material.

The helix-forming operation may be further aided by feeding the annealed, flattened, compensated wire through a series of transverse rollers such that the wire is pre-formed into a slightly oversized helix of relatively large pitch. Another method is to use a deep ACME-type thread as a fixture to prevent the flat wire from folding over as it is pre-formed into a helix. In any case, the work-hardened helix may then be re-annealed, leaving it in a softened condition near the desired shape (except for pitch and leads) for final hand working. Hand-working the reverse bends for the leads is less critical, as some spreading is normally acceptable.

Strongly Coupled Ring Resonators. The above transparent multinuclear solenoid typically has an upper practical frequency-diameter (fd) product of about 10 MHz-m (for two turns) and usually finds applications at much lower fd products, where sample losses are small compared to coil losses. For higher fd products, especially with relatively small samples, efficient multinuclear tuning becomes difficult, so coils are usually fixed-tuned. Even when sample losses dominate, substantial improvements, especially in $B_1$ homogeneity, may also be achieved in the open-loop-gap resonator by applying the conductor geometry of the edge-wound solenoid.

Figure 3:
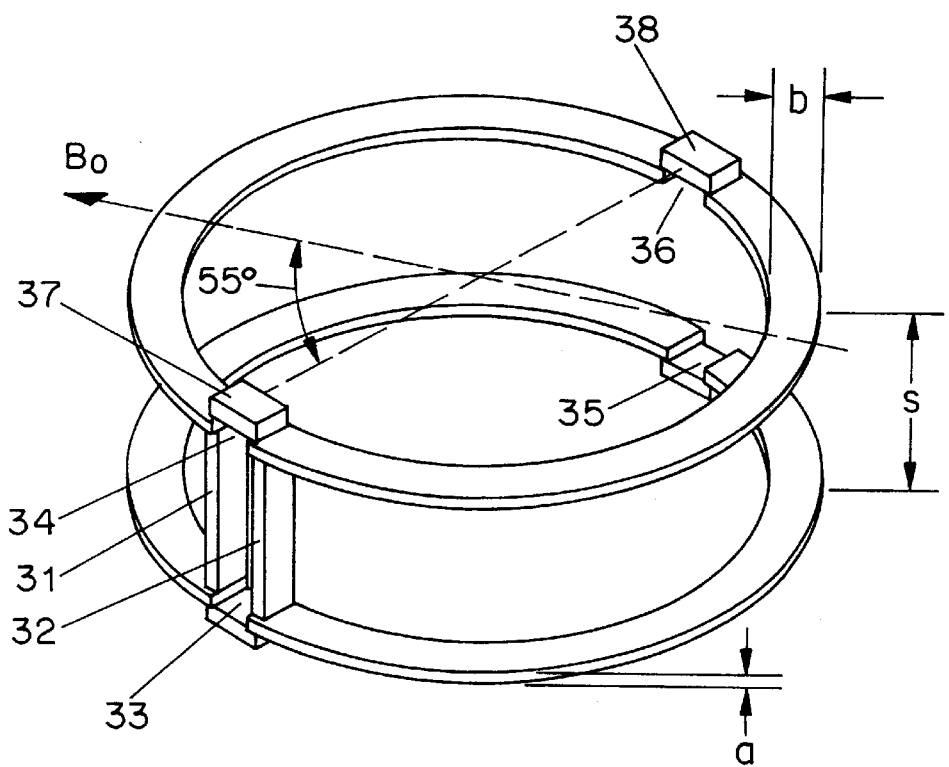
FIG. 3 illustrates the segmented, strongly coupled ring-resonator.

The MR coupled ring resonator as shown in FIG. 3, comprised of two tightly coupled segmented planar ring resonators satisfying the Helmholtz condition, similar to the microscopy coils of Banson et al but with predominately lumped rather than distributed capacitance, with balanced transmission-line coupling, and with effective segmentation to reduce sample dielectric losses, produces an improved imaging coil for moderate-sized samples oriented transverse to $B_0$ in a superconducting magnet. Even though it produces linear rather than circular polarization, it is still often superior to alternative quadrature designs, especially for relatively short samples with limited access perpendicular to $B_0$.

Where $B_0$ homogeneity is critical, the magnetism of commercially available fixed capacitors is easily compensated for ring diameters as small as 5 mm using magic-angle capacitor positioning and diamagnetic materials, as also disclosed in a co-pending application.

The paralleling bands 31, 32 form a balanced transmission line between the planar ring resonators and are connected near the gaps 33, 34 to improve $B_1$ homogeneity (by equalizing gap voltages) and simplify tuning by moving the anti-parallel mode further from the parallel (homogeneous) mode. Preferably, conductor radial width b is greater than 0.1r, the maximum separation distance s is less than 5b; and conductor thickness a is greater than $4\delta$, where $\delta$ is the classical skin depth at the resonant frequency ($\delta$ is about 0.01 mm in copper at the common MR frequency of 64 MHz, for example). For small and moderate sized samples such that the loaded $Q_L$ is greater than $Q_0/5$, additional thickness on the inner edges (up to $15\delta$) improves $Q_0$ a little, but improvements in filling factor from increases in b are often more beneficial and have apparently not been recognized in the prior art.

Each of the two ring resonators is tuned individually using capacitors 37, 38 to a frequency typically 5% to 20% above the desired coupled frequency in the environment (sample and shields) in which it will be used. With two ring resonators as shown and for b<0.3r, highest $B_1$ homogeneity over a large sample volume is obtained when (r+b/2)>>s. Alternatively, s can equal r+b/2. The two ring resonators may be inclined somewhat with respect to the axis to better accommodate the sample—for breast imaging, for example. Related prior art (as in U.S. Pat. No. 5,363,845) has generally included a second transmission line between the opposite pair of gaps 35, 36 for improved $B_1$ homogeneity under asymmetric loading conditions, but it also reduces transverse transparency (which may adversely affect homogeneity of the body transmit coil) unless the transmission lines are also capacitively segmented, which adversely affects tunability. Hence, a single transmission line is often preferred, and capacitor 37 would be less than capacitor 38 to compensate for the effects of the asymmetric coupling. Normally, the transmission-line impedance of paralleling bands 31, 32 is between 50 $\Omega$ and 200 $\Omega$ for best $B_1$ homogeneity and efficiency. A foam-insulated, electrically isolated, conductive, shielding strip may be added between the transmission line and the sample for reduced sample losses. Adjustable capacitors for fine tuning, balancing, and matching are connected near the midpoint of the coupling line defined by paralleling bands 31, 32 for best tunability. Tunability is extremely important, as the resonant frequencies depend strongly on coupling to a variable sample, rf shields, and nearby coils, which may or may not be tuned simultaneously and may need to be driven in phase or out of phase if present simultaneously. Balanced coupling lines of moderate impedance, low loss, and high propagation factor are beneficial to this end. External rf shielding would always be present but is not shown for graphic clarity.

When greater sample length is needed, additional ring resonators may be connected in parallel to extend axially the region of homogeneous $B_1$. In this case, the two outer-most ring resonators would typically be tuned independently to about 10% to 20% above the coupled frequency, but the inner resonators would be tuned 15% to 100% above the coupled frequency, depending primarily on s/r, b/s, and the characteristic impedance of the coupling lines. In this way it may be said that each ring is independently tuned to a frequency greater than the coupled frequency $f_0$ but less than $2f_0$ in a predetermined environment. The use of tight coupling between resonators helps to maintain high $B_1$ homogeneity even with large errors in the separate resonators. For very large fd products, four capacitive segments in each ring resonator would be preferred for reduced sample dielectric losses. This also allows two coupling lines per resonator (on opposite sides from each other) without segmentation of the lines and with no degradation in transverse transparency. For large samples, the segments are normally azimuthally spaced at 90° intervals and arbitrarily with respect to $B_0$.

Figure 4:
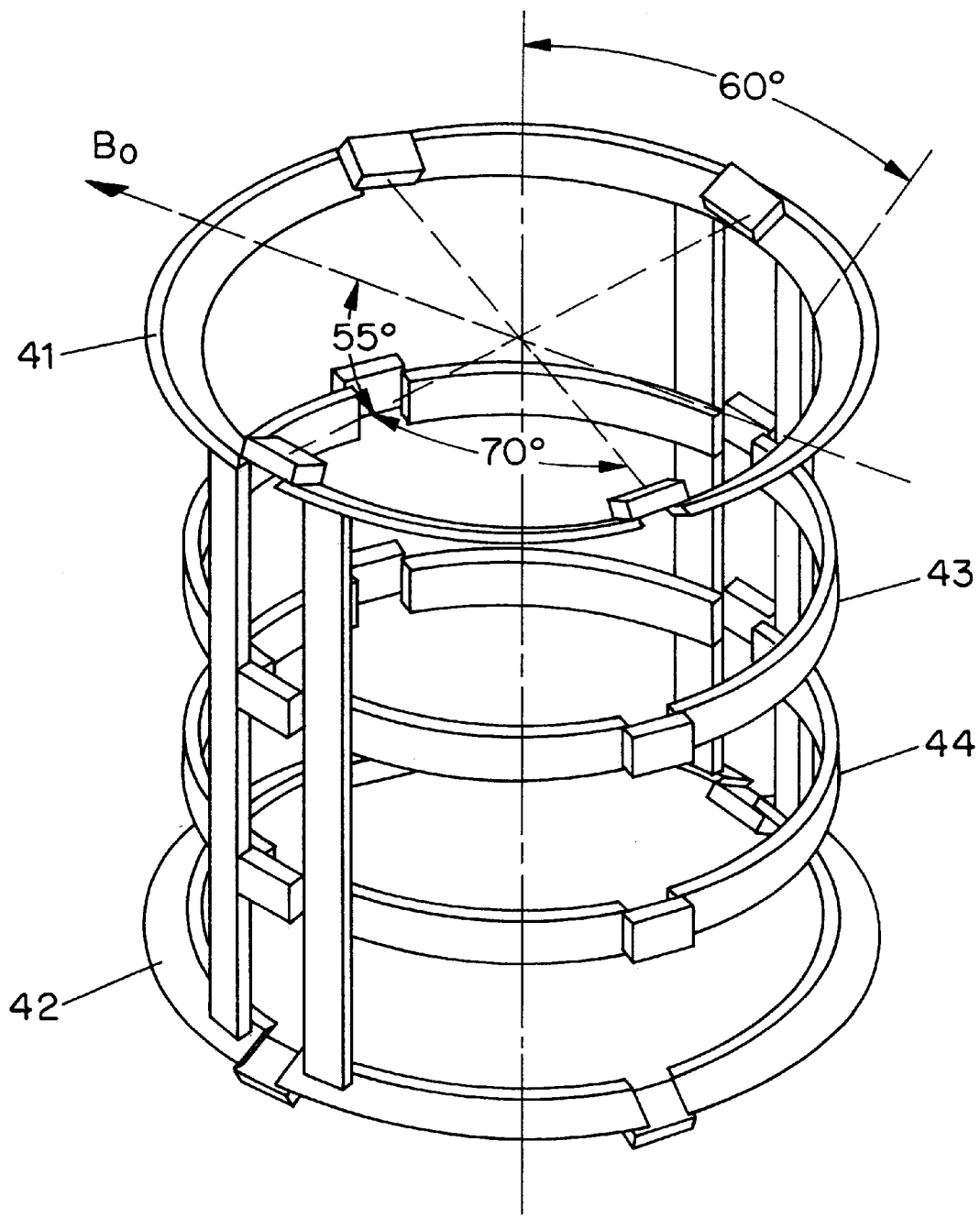
FIG. 4 illustrates a coupled ring-resonator for UHF microscopy.

FIG. 4 illustrates several additional improvements, especially for microscopy at very high fields with small samples for fd up to 60 MHz-m. The gaps are preferably located at ±54.7° (the magic angle, the angle at which the dipolar field vanishes) with respect to the $\pm B_0$ axis to minimize magnetic susceptibility effects of the capacitors and transmission lines in the adjacent sample region. Additional improvement in $Q_0$ is obtained, especially for small resonators with limited space for increasing b, by forming the outermost conductor rings 41, 42 from conical sections, preferably such that the foil surfaces are inclined outward at approximately 60° (and thus at an angle greater than 40° and less than 80°) with respect to the resonator axis to reduce current crowding at the inside edges. For small coils, it is often beneficial to attach diamagnetic materials such as quartz or silver to the capacitors to compensate the paramagnetism of the dielectrics and electrodes normally found in commercial chip capacitors. Unlike the edge-wound solenoid, there is usually little benefit from magnetic compensation of the outermost conductor rings 41, 42 and inner rings 43, 44, as their thickness a is usually very small compared to r, and b is typically under 0.4r, as fd is often greater than 10 MHz-m. However, for the smallest coils, magnetically compensated sandwich conductor rings (Cu—Al—Cu or Cu—CuNi—Cu) would be preferred.

For longer sample regions, four or more ring resonators, axially spaced less than r, may be used to extend axially and to improve the homogeneous $B_1$ region. For many microscopy applications, the inner rings 43, 44 would be flat wrapped and wider than shown for improved $B_1$ homogeneity, although in some cases the reduced stray capacitance and improved transverse transparency of narrow bands or the edgewise configuration is of greater importance.

A single truncated conical section resonator, such as one of outmost conductor rings 41 or 42 in FIG. 4, may be used alone to produce an improved surface coil. With the sample adjacent to the minor-diameter edge, the conical section permits reduced capacitive coupling to the sample (from its narrow contact area) with the improved Q and $\eta_F$ of a wider ring. However, the other orientation of the conical section (the sample adjacent to the major diameter of the conical section) has nearly as much reduced capacitive coupling and improved $Q_0$ (compared to the widened, flat surface coil of Carlson, for example) and substantially improved $B_1$ homogeneity, which also helps $Q_L$ and sensitivity. The optimum angle of the major axis of the conductor cross-section with respect to the coil axis is usually about 60° and thus greater than 30, but angles up to 85° would be chosen where vertical space near the sample surface is limited. The conical section resonator need not be circular, as a truncated elliptical section may better fit the sample region of interest. In this case, r would refer to the minor half-axis of the elliptical section. The primary disadvantage of the conical-section surface coil is that, being a three-dimensional structure, it has extremely limited flexibility. While it is well suited to the spine, heart, eye, and temporal blood vessels, for example, many other applications would require specially designed shapes for best performance.

The four-segment magic-angle-capacitor version, with 110° between two adjacent gaps and 70° between another pair of gaps, reduces susceptibility artifacts from the capacitors when properly aligned with respect to $B_0$ and provides nearly as much reduction in dielectric losses as does prior art 90° segmentation.

I claim:

1. An NMR probe for use in an external field $B_0$, said probe comprising:

a solenoidal rf sample coil with more than one turn of flattened conductor in a helical path around a coil axis, said conductor having width b along major cross-sectional axis and thickness a along minor cross-sectional axis, a less than b, said major axis aligned at an angle greater than 40° with respect to said coil axis throughout a majority of its helical path, said major axis thereby aligned within 50° of perpendicular to said coil axis, said helix having pitch near the center greater than 1.8a but less than 4b+a, thereby being less than 5b.

2. The NMR probe as in 1 wherein said pitch is greater near the center than near the ends of said coil.

3. The NMR probe as in 1 wherein said b>1.2a.

4. The NMR probe as in 1 wherein said coil has fewer than 9 turns and is tuned to a frequency at which the classical skin depth in said conductor is less than a/4.

5. The NMR probe as in 1 wherein said conductor has magnitude of bulk magnetic susceptibility substantially less than that of pure copper.

6. A method of producing a magnetically compensated flattened conductor of a magnetic resonance probe by the following steps:

a copper tube is partially flattened, more than one paramagnetic wire of predetermined magnetization is inserted into the partially flattened tube, the tube is then flattened an additional amount;

whereby said conductor has magnitude of bulk magnetic susceptibility substantially less than that of pure copper.

7. The method of 6 wherein at least one of said paramagnetic wires is a silver-plated copper-nickel alloy, said copper-nickel alloy comprising 4% to 14% nickel, less than 0.01% (Fe+Co+Mn), and at least 0.2% additional alloying content from the following set: Al, Cr, Mo, Nb, Re, Ta, Ti, Si, Sn, V, W.

8. A method of producing a magnetically compensated flattened conductor of a magnetic resonance probe by the following steps:

a copper tube is partially flattened, a paramagnetic strip of predetermined magnetization is inserted into the partially flattened tube, the tube is then flattened an additional amount, and the conductor is then annealed;

whereby said conductor has magnitude of bulk magnetic susceptibility substantially less than that of pure copper.

9. A coupled ring resonator for use at frequency defining value $f_0$ in an external field $B_0$, said resonator comprising:

a plurality of segmented rings spaced apart at maximum separation s along an axis, said rings further characterized as each comprising a conductive ring having inside radius r, cross-section major axis of width b where b>0.1r, thickness a, a plurality of azimuthal gaps, and tuning capacitors across said gaps such that each said ring is independently tuned to a frequency greater than said $f_0$ but less than $2f_0$ in a predetermined environment, said rings further characterized as coupled by a balanced transmission line connected to opposite sides of a gap in each said ring, the first of said rings further characterized in that said major axis is inclined at an angle greater than 40° with respect to said coil axis said major axis thereby aligned within 50° of perpendicular to said coil axis.

10. The resonator of 9 wherein s<5b and a>4δ, where δ is the classical rf skin depth in copper at said $f_0$.

11. The resonator of 9 further characterized in that said angle is also less than 80°.

12. The resonator of 9 wherein said a pair of gaps are spaced azimuthally at approximately 110°.

13. The resonator of 9 containing two of said ring resonators wherein s=(r+b/2).

14. The resonator of 11 wherein diamagnetic material is attached to said capacitors for magnetic compensation.

15. A three-dimensional conical-section MR surface coil for use at frequency defining value $f_0$ in an external field $B_0$, said coil comprising:

a segmented truncated-conical-section conductor having minor half-axis r, conductor cross-section major axis of width b where b>0.1r and thickness a, four azimuthal gaps, and tuning capacitors across said gaps such that said ring is tuned approximately to said frequency $f_0$, said conductor further characterized in that said major axis is inclined at an angle greater than 30° but less than 85° with respect to the axis of said coil, said major axis thereby aligned more than 30° from flat-wound relative to said coil axis.

16. The coil of 15 wherein a>4δ, where δ is the classical rf skin depth in copper at said $f_0$.

17. The coil of 15 wherein said two of said gaps are spaced azimuthally at approximately 110°.

18. A conical MR surface coil for use at frequency defining value $f_0$ in an external field $B_0$, said coil comprising:

a segmented truncated-conical-section conductor having minor half-axis r, conductor cross-section major axis of width b where b>0.1r and thickness a, two azimuthal gaps, and tuning capacitors across said gaps such that said ring is tuned approximately to said frequency $f_0$, said ring further characterized in that said major axis is inclined at an angle greater than 30° but less than 85° with respect to the axis of said coil, said major axis thereby aligned more than 30° from flat-wound relative to said coil axis, said gaps further characterized as aligned at approximately ± the magic angle with respect to said $B_0$.

19. The coil of 18 wherein a>4δ, where δ is the classical rf skin depth in copper at said $f_0$.

* * * * *